United States Patent
Lin et al.

(10) Patent No.: US 9,679,931 B2
(45) Date of Patent: Jun. 13, 2017

(54) CURVED IMAGE SENSOR SYSTEMS

(71) Applicant: OmniVision Technologies, Inc., Santa Clara, CA (US)

(72) Inventors: Wei-Feng Lin, HsinChu (TW); Chi-Chih Huang, HsinChu (TW)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 15/161,726

(22) Filed: May 23, 2016

(65) Prior Publication Data

US 2016/0268327 A1    Sep. 15, 2016

Related U.S. Application Data

(62) Division of application No. 14/618,703, filed on Feb. 10, 2015, now Pat. No. 9,349,763.

(51) Int. Cl.
*H01L 27/146* (2006.01)

(52) U.S. Cl.
CPC .... *H01L 27/14618* (2013.01); *H01L 27/1464* (2013.01); *H01L 27/14605* (2013.01); *H01L 27/14607* (2013.01); *H01L 27/14612* (2013.01); *H01L 27/14634* (2013.01); *H01L 27/14636* (2013.01); *H01L 27/14643* (2013.01); *H01L 27/14687* (2013.01); *H01L 27/14698* (2013.01); *H01L 27/14689* (2013.01); *H01L 2224/11* (2013.01)

(58) Field of Classification Search
CPC ............ H01L 27/307; H01L 27/1462; H01L 27/14625; H01L 27/14618; H01L 51/448; H01L 27/14605; H01L 27/14607; H01L 27/14612; Y02E 10/549; H04N 5/2253; H04N 5/369

USPC ............... 257/40, 432; 438/64, 65; 348/294
See application file for complete search history.

(56) References Cited

U.S. PATENT DOCUMENTS

| | | |
|---|---|---|
| 6,791,072 B1 | 9/2004 | Prabhu |
| 7,507,944 B1 | 3/2009 | Arnzen et al. |
| 2006/0038183 A1* | 2/2006 | Oliver ............... H01L 27/14618 257/79 |

(Continued)

FOREIGN PATENT DOCUMENTS

| | | |
|---|---|---|
| CN | 102479794 A | 5/2012 |
| JP | 2004063776 A | 2/2004 |
| TW | 201241995 A | 10/2012 |

OTHER PUBLICATIONS

Itonaga, et al., "A Novel curved CMOS Image Sensor Integrated with Imaging System", 2014 Symposium on VLSI Technology Digest of Technical Papers, 978-1-4799-3332-7/14, 2 pp.

(Continued)

*Primary Examiner* — Thomas L Dickey
*Assistant Examiner* — Changhyun Yi
(74) *Attorney, Agent, or Firm* — Lathrop & Gage LLP (57) ABSTRACT

A curved image sensor system includes (a) an image sensor substrate having a concave light-receiving surface, a pixel array located along the concave light-receiving surface, and a planar external surface facing away from the concave light-receiving surface, (b) a light-transmitting substrate bonded to the image sensor substrate by a bonding layer, and (c) a hermetically sealed cavity, bounded at least by the concave light-receiving surface, the light-transmitting substrate, and the bonding layer.

11 Claims, 7 Drawing Sheets

(56) References Cited

U.S. PATENT DOCUMENTS

| | | | |
|---|---|---|---|
| 2009/0115875 A1* | 5/2009 | Choi | H01L 27/14618 |
| | | | 348/294 |
| 2012/0147207 A1 | 6/2012 | Itonaga | |
| 2012/0182194 A1 | 7/2012 | Young et al. | |
| 2012/0299140 A1* | 11/2012 | Sekine | H01L 27/14607 |
| | | | 257/432 |
| 2014/0160327 A1* | 6/2014 | Enoki | H01L 27/307 |
| | | | 348/294 |
| 2015/0002711 A1* | 1/2015 | Itonaga | H01L 31/0203 |
| | | | 348/294 |

OTHER PUBLICATIONS

Translation of the first Office Action corresponding to Taiwanese Patent Application No. 105104361, dated Nov. 8, 2016, 2 pages.
Translation of the first Office Action corresponding to Chinese Patent Application No. 201610086038.4, dated Mar. 20, 2017, 4 pages.

* cited by examiner

FIG. 8

CURVED IMAGE SENSOR SYSTEMS

CROSS-REFERENCE TO RELATED APPLICATIONS

The present application is a divisional of U.S. patent application Ser. No. 14/618,703 filed Feb. 10, 2015, which is incorporated herein by reference in its entirety.

BACKGROUND

The quality of a digital image is limited by imperfections of the image sensor, imperfections of the imaging objective, or both. Generally, an image formed by an imaging objective on an image sensor is subject to deviations from ideal image formation. For example, the imaging objective may form an image that has noticeable blur or distortion. The image sensor imposes electronic noise on the image. In addition, the image sensor has optical limitations that may compromise actual detection of the image formed thereon by the imaging objective. For example, each pixel of the image sensor has a limited acceptance angle, that is, each pixel is able to detect light only within a certain range of incidence angles on the image sensor. For this reason, peripherally located pixels may collect light from the imaging objective with less efficiency than centrally located pixels, resulting in vignetting of the image.

High-performance digital cameras typically use complex lens systems designed to self-compensate, to some extent, for optical aberrations. In some cases, lens systems are designed to deliver the light to the image sensor at incidence angles that are relatively uniform across the pixel array, in order to reduce image artifacts caused by the finite acceptance angle of each pixel. High-performance lens systems require high-precision manufacturing and/or additional lens elements and are therefore relatively costly to produce. However, even high-end expensive lens systems may still fail to eliminate all noticeable image artifacts or, alternatively, have limited performance range such as a limited field of view.

SUMMARY

In an embodiment, a method for manufacturing one or more curved image sensor systems includes bonding a light-transmitting substrate to an image sensor wafer having at least one photosensitive pixel array, to form a composite wafer with a respective hermetically sealed cavity between the light-transmitting substrate and each of the at least one photosensitive pixel array. This bonding step is performed in an environment of elevated pressure relative to atmospheric pressure. The method further includes thinning the image sensor wafer of the composite wafer to induce deformation of the image sensor wafer to form, from each of the at least one pixel array, a respective concavely curved pixel array.

In an embodiment, a curved image sensor system includes an image sensor substrate having a concave light-receiving surface, a photosensitive pixel array located along the concave light-receiving surface, and a planar external surface facing away from the concave light-receiving surface. The curved image sensor system also includes a light-transmitting substrate bonded to the image sensor substrate by a bonding layer, and a hermetically sealed cavity that is optically upstream from the pixel array and bounded at least by the concave light-receiving surface, the light-transmitting substrate, and the bonding layer.

DETAILED DESCRIPTION OF THE EMBODIMENTS

Figure 1:
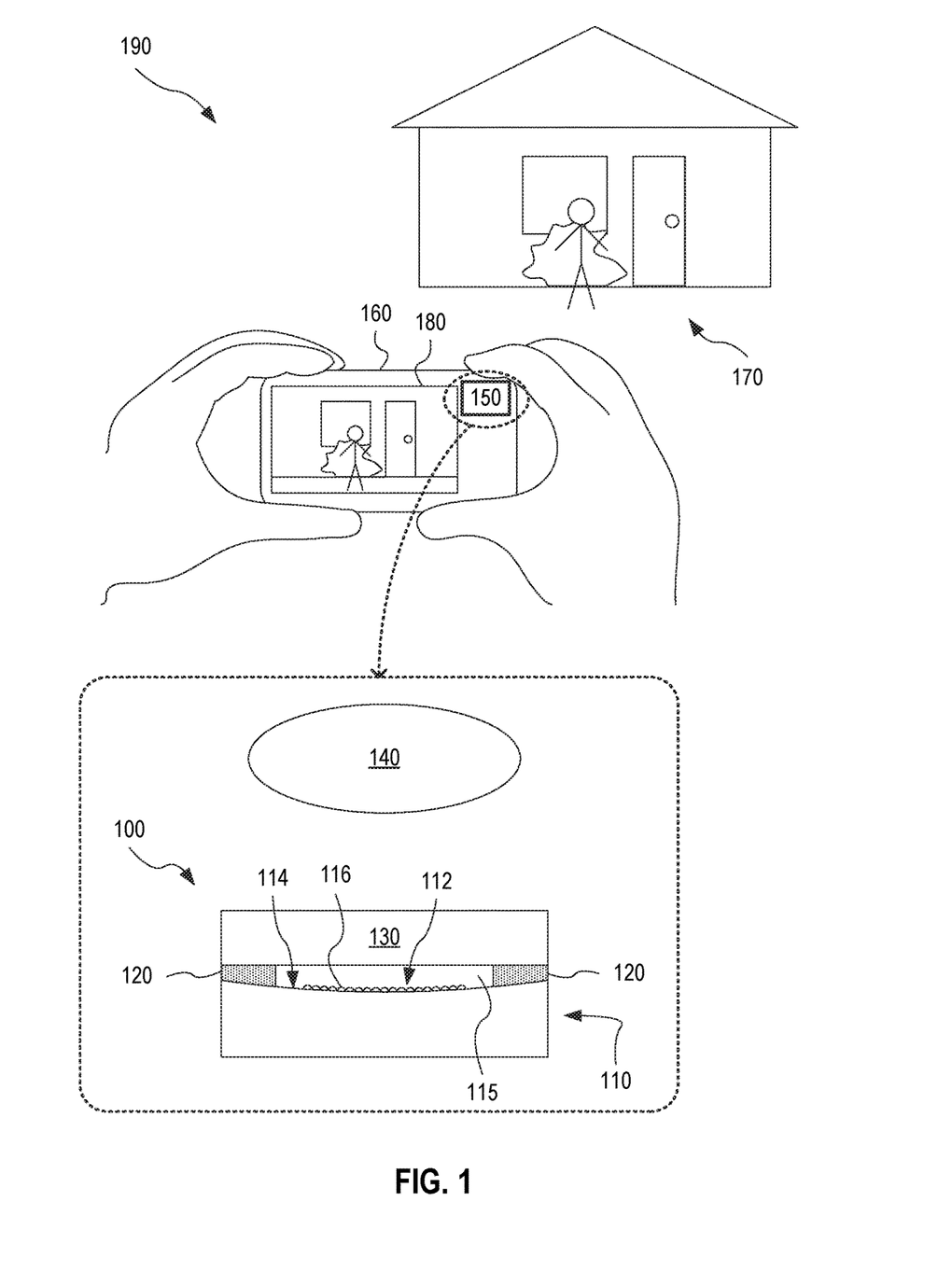
FIG. 1 illustrates a curved image sensor system implemented in an exemplary use scenario, according to an embodiment.

FIG. 1 illustrates one exemplary curved image sensor system 100 implemented in one exemplary use scenario 190. In scenario 190, curved image sensor system 100 is coupled with an imaging objective 140 to form a camera module 150. Camera module 150 is implemented in a camera device 160. Imaging objective 140 may be composed of a single lens, or be a composite system with, for example, multiple lenses, one or more filters, and/or one or more apertures. Curved image sensor system 100 is configured to reduce or eliminate certain artifacts that limit the performance achievable using conventional planar image sensors. Such artifacts may include field curvature and/or position-dependent detection properties within the associated pixel array. By virtue of these benefits, camera module 150 may achieve performance superior to that of a camera module based upon a conventional planar image sensor. Alternatively, or in combination therewith, camera module 150 may have relaxed requirements to the imaging objective, thereby reducing manufacturing cost, as compared to a camera module based upon conventional planar image sensor.

FIG. 1 depicts curved image sensor system 100 in cross-sectional side-view. Curved image sensor system 100 includes a curved image sensor 110 having a concavely curved light-receiving surface 114 and a photosensitive pixel array 112 located along light-receiving surface 114. Hence, pixel array 112 is curved. Pixel array 112 includes an array of photosensitive pixels 116. For clarity of illustration, not all photosensitive pixels 116 are labeled in FIG. 1. The number of photosensitive pixels 116 in pixel array 112 may different from what is indicated in FIG. 1. For example, pixel array 112 may include hundreds, thousands, millions, or tens of millions of photosensitive pixels 116. Curved image sensor system 100 further includes a light-transmitting substrate 130 and a bonding layer 120 that bonds light-transmitting substrate 130 to curved image sensor 110. Bonding layer 120 is, for example, a spacer with an adhesive. Herein, a "light-transmitting" component refers to a component capable of at least partly transmitting light of wavelength within the sensitivity range of pixel array 112. Light-receiving surface 114, light-transmitting substrate 130, and bonding layer 120 form a hermetically sealed cavity 115 within curved image sensor system 100 and above pixel array 112. The pressure within hermetically sealed cavity 115 is elevated relative to atmospheric pressure. Hermetically sealed cavity 115 is optically upstream from pixel array 112.

In scenario 190, imaging objective 140 forms an image of scene 170 on pixel array 112. Pixel array 112 detects the image formed by imaging objective 140 and produces, optionally in cooperation with other processing functions of camera device 160, an electronic image 180 of scene 170. Since pixel array 112 is curved, electronic image 180 is less affected by several artifacts present in images captured using a planar pixel array, as used in conventional image sensors.

In an embodiment, curved image sensor 110 is a complementary metal-oxide-semiconductor (CMOS) image sensor. For example, curved image sensor 110 is a frontside-illuminated CMOS image sensor, wherein electrical connections to pixels 116 are located between light-receiving surface 114 and the photosensitive elements of pixels 116. Frontside-illuminated CMOS image sensors are simpler and cheaper to manufacture than backside-illuminated CMOS image sensors. However, the interfering location of the electrical connections makes frontside-illuminated CMOS image sensors particularly prone to produce images with vignetting. Therefore, frontside-illuminated CMOS image sensors, especially, may benefit from being constructed according to the curved configuration of curved image sensor system 100.

Figure 2A:
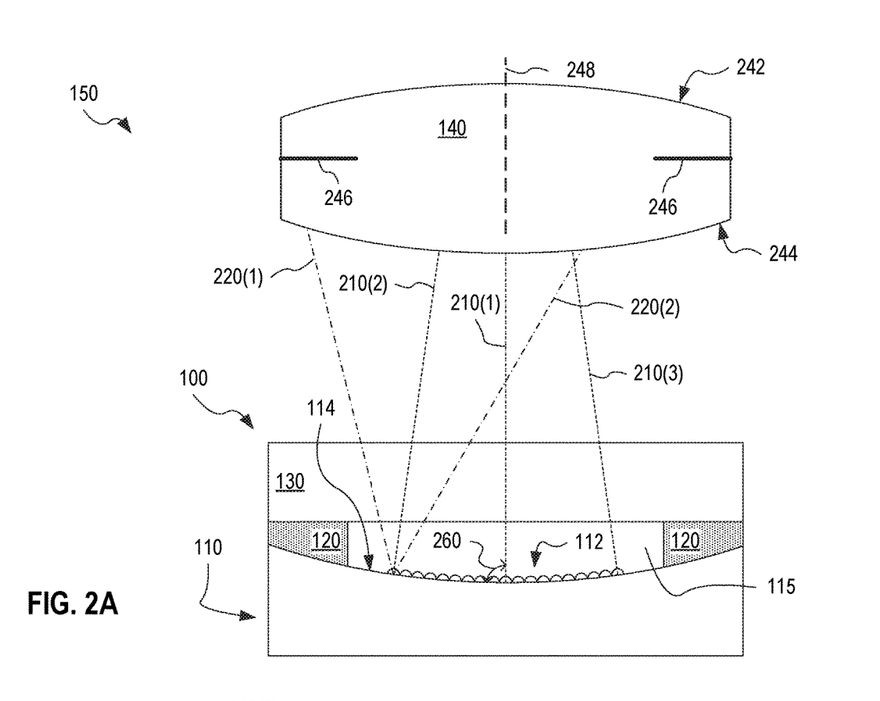
FIGS. 2A, 2B, and 2C illustrate optical properties of the curved image sensor system of FIG. 1, related to use of the curved image sensor system in a camera module, according to an embodiment.
Figure 2B:
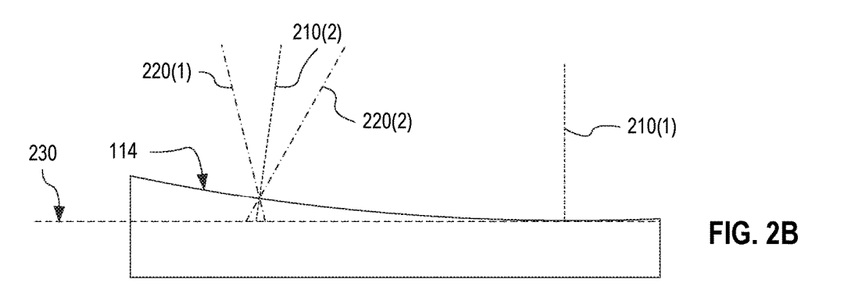
Figure 2C:
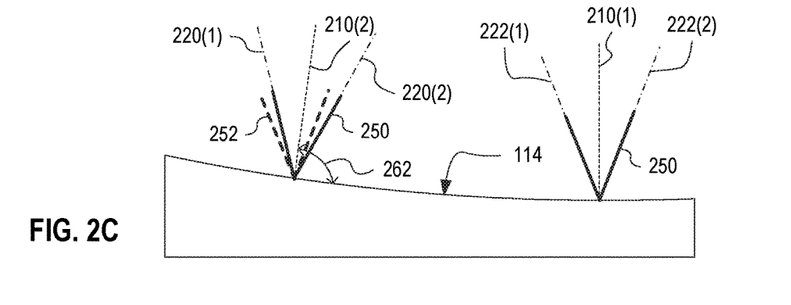

FIGS. 2A, 2B, and 2C illustrate certain exemplary optical properties of curved image sensor system 100, related to use of curved image sensor system 100 in camera module 150 as shown in FIG. 1. FIGS. 2A, 2B, and 2C are best viewed together.

FIG. 2A schematically indicates properties of imaging objective 140, which are applicable to a generic imaging objective. Imaging objective 140 has an optical axis 248. Imaging objective 140 includes a first lens surface 242 closest to scene 170 (scene 170 is not shown in FIG. 2A) and a last lens surface 244 closest to curved image sensor system 100. Imaging objective 140 also has an aperture stop 246. Aperture stop 246 may be located between lens surfaces 242 and 244, closer to scene 170 than lens surface 242, or closer to curved image sensor system 100 than lens surface 244.

In an embodiment, pixel array 112 is centered about optical axis 248. In an embodiment, optical axis 248 intersects light-receiving surface 114 at or near the location characterized by the maximum distance, in dimension parallel to optical axis 248, between pixel array 112 and light-transmitting substrate 130, such that angle 260 between ray 210(1) and the associated portion of light-receiving surface 114 is 90° or close to 90°.

FIG. 2A further indicates rays 210(1), and 210(2), and 210(3), which propagate from an object point in scene 170, through the center of aperture stop 246, and toward pixel array 112. Rays 210(2) and 210(3) are chief rays, i.e., rays 210(2) and 210(3) originate from respective object points, in scene 170, away from optical axis 248. Ray 210(1) is the equivalent of a chief ray for an object point, in scene 170, located on optical axis 248. Herein, chief ray angles associated with imaging objective 140 are considered to include ray 210(1). Ray 210(1) is parallel to optical axis 248 and impinges on pixel array 112 at or near the center of pixel array 112. Chief rays 210(2) and 210(3) impinge on pixel array 112 at respective peripheral locations thereof. FIG. 2A also indicates rays 220(1) and 220(2). Rays 220(1) and 220(2) originate from the same object point as chief ray 210(2), through aperture stop 246 at two opposite extreme edges of aperture stop 246, and toward pixel array 112. Rays 220(1) and 220(2) impinge on pixel array 112 at the same location as chief ray 210(2). Rays 220(1) and 220(2) indicate the maximum angular deviation from chief ray 210(2), associated with the same object point as chief ray 210(2). Hence, rays 220(1) and 220(2) define the bundle of rays, from imaging objective 140, incident on pixel array 112 at the same location as chief ray 210(2).

FIG. 2B is a close-up of chief ray 210(2) and rays 220(1) and 220(2) as these rays impinge on light-receiving surface 114, as shown in FIG. 2A. For clarity of illustration, pixel array 112 is not shown in FIG. 2B. In the embodiment shown in FIG. 2B, light receiving surface 114 is shaped to reduce, minimize, or eliminate field curvature in electronic image 180. Generally, field curvature results from an imaging objective having a non-planar image plane, i.e., the imaging objective images a scene onto a curved image plane known in the art as the Petzval surface. In this embodiment, light-receiving surface 114, at pixel array 112, is shaped at least approximate the Petzval surface of imaging objective 140. For comparison, line 230 indicates the location of a corresponding planar pixel array located at the focal point, on optical axis 248, of imaging objective 140. It is apparent that rays 220(1), 220(2), and 210(2) impinge on line 230 at different locations, which would result in blur in an electronic image captured using imaging objective 140 and a conventional planar image sensor. However, light-receiving surface 114, at pixel array 112, is shaped to at least reduce this blur.

In one example of the embodiment shown in FIG. 2B, light-receiving surface 114, at pixel array 112, coincides with the Petzval surface of imaging objective 140. In this example, curved image sensor system 100 eliminates field curvature in electronic image 180 captured by camera module 150. In another example, light-receiving surface 114, at pixel array 112, coincides with the Petzval surface of imaging objective 140, at least to second order in the distance from optical axis 248. In this example, curved image sensor system 100 mostly eliminates field curvature in electronic image 180 captured by camera module 150. In yet another example, light-receiving surface 114, at pixel array 112, is close to the Petzval surface of imaging objective 140. In this example, curved image sensor system 100 significantly reduces field curvature in electronic image 180 captured by camera module 150, as compared to field curvature in an image captured using imaging objective 140 and a conventional planar image sensor. In a further example, light-receiving surface 114, at pixel array 112, is curved in the same direction as the Petzval surface of imaging objective 140. In this example, curved image sensor system 100 reduces field curvature in electronic image 180 captured by camera module 150, as compared to field curvature in an image captured using imaging objective 140 and a conventional planar image sensor.

FIG. 2C is the same close-up as FIG. 2B. FIG. 2C, however, shows properties related to the light collection efficiency of pixels 116 of pixel array 112. Generally, an image sensor pixel is capable of detecting only rays incident within a limited range of angles away from normal incidence. For example, the acceptance angle may be ±20° relative to normal incidence. Each pixel 116 of pixel array 112 is capable of detecting light incident within a cone 250 (thick solid line). In one example, curved image sensor system 100 and imaging objective 140 are configured such that cone 250 includes all rays within the bundle associated with ray 210(1). This bundle is defined by rays 222(1) and 222(2), which originate from the same object point as ray 210(1) but pass through aperture stop 246 at extreme edges thereof, similarly to rays 220(1) and 220(2).

Chief ray 210(2) is tilted relative to ray 210(1). However, the curvature of light-receiving surface 114 at least partly compensates for this tilt. FIG. 2C shows an embodiment, wherein incidence angle 262 of chief ray 210(2) onto light-receiving surface 114 is substantially 90° to facilitate optimal collection of light within the bundle defined by rays 220(1) and 220(2). For example, cone 250, associated with a pixel 116 that detects chief ray 210(2), includes the bundle defined by rays 220(1) and 220(2).

For comparison, cone 252 indicates the acceptance angle of a pixel, of a conventional planar image sensor, located where chief ray 210(2) impinges on light-receiving surface 114. Cone 252 does not include the full bundle defined by rays 220(1) and 220(2), and the conventional planar image sensor therefore has diminished light collection efficiency at peripheral locations (such as the location for detection of chief ray 210(2)) relative to central locations (such as the location for detection of ray 210(1)). This leads to vignetting of images captured using a conventional planar image sensor.

In one embodiment, light-receiving surface 114 is shaped to be normal to all chief rays incident upon pixel array 112, to eliminate or at least significantly reduce vignetting. In another embodiment, light-receiving surface 114 is shaped to reduce deviations from normal incidence of chief rays onto pixel array 112, as compared to such deviations experienced when using a conventional planar image sensor. This embodiment reduces vignetting as compared to systems based upon a conventional planar image sensor.

Figure 3:
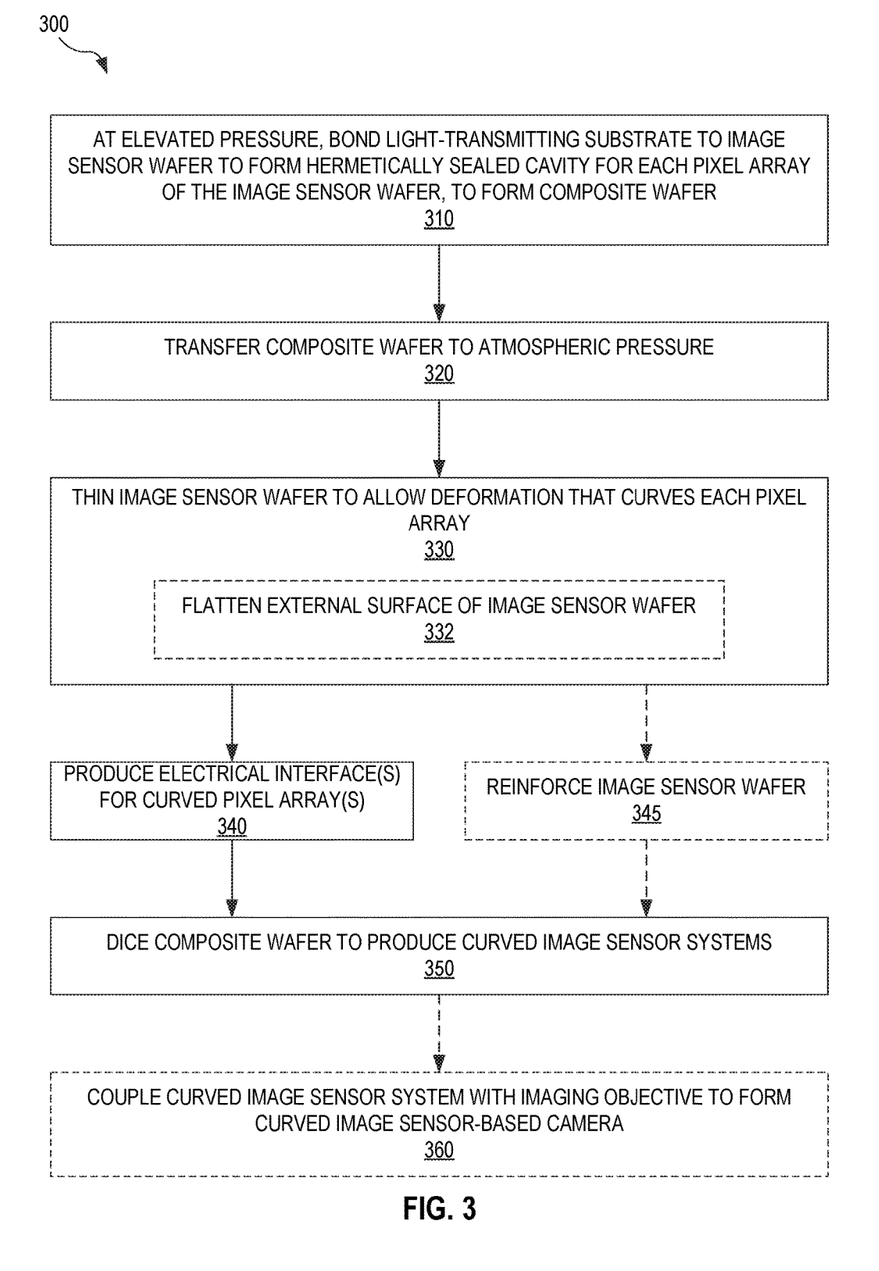
FIG. 3 illustrates a method for manufacturing a curved image sensor system and, optionally, an associated camera module, according to an embodiment.

FIG. 3 illustrates one exemplary method 300 for manufacturing curved image sensor system 100 (FIG. 1) and, optionally, camera module 150. Method 300 utilizes pressure differentials to form concavely curved light-receiving surface 114. In an embodiment, method 300 is performed at the wafer-level for manufacture of a plurality of curved image sensor systems 100, for example hundreds or thousands of curved image sensor systems 100 per wafer. Below, method 300 is discussed in the context of wafer-level production. However, without departing from the scope hereof, method 300 may apply to wafers including only a single pixel array 112 for production of only a single curved image sensor system 100.

A step 310 is performed in an environment of elevated pressure relative to atmospheric pressure. At the elevated pressure, a light-transmitting substrate is bonded to an image sensor wafer. The image sensor wafer includes a plurality of pixel arrays 112 that are substantially planar at this point in the method. The light-transmitting substrate is bonded to the light-receiving surface of the image sensor wafer, i.e., the side of the image sensor wafer associated with the light-receiving surface of pixel arrays 112. At this point in the method, each light-receiving surface of a respective pixel array 112 is a substantially planar precursor for concavely curved light-receiving surface 114. Step 310 includes applying bonding layer 120 between the light-transmitting substrate and the image sensor wafer, around each pixel array 112, to form a hermetically sealed cavity 115 for each pixel array 112. Since step 310 is performed at elevated pressure, hermetically sealed cavity 115 has elevated pressure. Step 310 results in the production of a composite wafer that includes both the light-transmitting substrate and the image sensor wafer.

In an embodiment, the image sensor wafer is a CMOS image sensor wafer and pixel arrays 112 are CMOS pixel arrays, such as frontside-illuminated CMOS pixel arrays.

Herein, "atmospheric pressure" refers to the ambient pressure at the place of manufacturing. In most cases, this pressure is the pressure of the Earth atmosphere, or at least similar thereto, and is also similar to the pressure of the environment wherein curved image sensor system 100 is to be used. However, the "atmospheric pressure" may differ from the pressure of the Earth atmosphere without departing from the scope hereof. For example, curved image sensor system 100 may be manufactured in an environment that, for other reasons such as cleanliness, is operated at an "atmospheric pressure" higher or lower than the pressure of the Earth atmosphere. In one example, curved image sensor system 100 is intended for operation in an atypical environment, such as a vacuum chamber. In this example, the "atmospheric pressure" may be chosen to be similar to that of the vacuum chamber.

In a step 320, the composite wafer formed in step 310 is transferred to atmospheric pressure. When placed in an environment of atmospheric pressure, the pressure within hermetically sealed cavities 115 is elevated relative to the pressure outside the composite wafer.

In a step 330, the image sensor wafer is thinned to allow deformation of the light-receiving surface at each pixel array 112. Step 330 thins the image sensor wafer by removing material from the external surface of the image sensor wafer, which faces away from the light-transmitting substrate. Step 330 may include grinding the image sensor. The deformation of the light-receiving surfaces is driven by the pressure differential between the elevated pressure, within each hermetically sealed cavity, and the atmospheric pressure outside the composite wafer. As step 330 thins the image sensor wafer, the image sensor wafer becomes increasingly deformable, such that the pressure differential concavely curves the respective light-receiving surface associated with each pixel array 112. This results in the formation of a plurality of concavely curved light-receiving surfaces 114 with, now, a respective plurality of curved pixel arrays 112.

In an embodiment, the light-transmitting substrate is significantly less deformable than the thinned image sensor wafer, such that the pressure differential leaves the light-transmitting substrate substantially unmodified. For example, the light-transmitting substrate is a glass substrate, optionally with one or more optical coatings thereon, and the image sensor wafer is silicon or silicon-based. Without departing from the scope hereof, the light-transmitting substrate may be different from a glass substrate. In one such example, the light-transmitting substrate is composed of plastic, and/or another light-transmitting substance, and has a thickness sufficient to make the light-transmitting substrate significantly more rigid than the thinned image sensor wafer.

In order to produce light-receiving surfaces 114 with a pre-specified curvature, method 300 performs steps 310 and 330 with according parameter choices. The pre-specified curvature is, for example, a curvature that results in beneficial properties of camera module 150 as discussed in reference to FIGS. 1, 2A, 2B, and 2C. Given certain material properties of the image sensor wafer, relevant parameters include (a) the elevated pressure of step 310, (b) the thickness of the image sensor wafer after thinning in step 330, and (c) the dimensions of each hermetically sealed cavity 115.

Optionally, step 330 includes a step 332 of flattening the external surface of the image sensor wafer. In one example, step 330 uniformly grinds the image sensor wafer on a timescale similar to, or longer than, the timescale characteristic of deformation of the image sensor wafer. In this example, the grinding process inherently flattens the external surface.

In an alternate embodiment, not shown in FIG. 3, steps 310, 320 and 330 are rearranged to be performed in the order 310, 330 (without step 332), and 320, such that also step 330 is performed at elevated pressure. In this embodiment, the image sensor is thinned at elevated pressure, and the deformation to concavely curve the light-receiving surfaces happens when subsequently transferring the composite wafer to atmospheric pressure. In this embodiment, step 332 may be added after step 320 to flatten the external surface.

In a step 340, method 300 modifies the composite wafer to produce electrical interfaces for each of the curved pixel arrays 112. Step 340 may utilize methods known in the art.

In an optional step 345, method 300 reinforces the composite wafer, for example by bonding a reinforcing substrate to the image sensor wafer. This reinforcement may serve to maintain the curvature of light-receiving surfaces 114, regardless of the pressure in the environment wherein curved image sensor system 100 is implemented. For example, the reinforcement may ensure that the performance of curved image sensor system 100 is the same at sea-level as at higher altitudes.

In a step 350, the composite wafer is diced to produce a plurality of curved image sensor systems 100. Step 350 may dice the composite wafer using a saw blade, laser cutting, or other methods/tools known in the art.

In an optional step 360, each of one or more of the plurality of curved image sensor systems 100 is coupled to a respective imaging objective 140 to produce a respective camera module 150.

Without departing from the scope hereof, steps 310, 320, and 330, and optionally step 332, may form the basis for a standalone method for forming the composite wafer that is the end-product of step 330. Such a standalone method may be followed by alternate methods for processing the composite wafer to produce a plurality of curved image sensor systems 100, such as methods known in the art.

Figure 4:
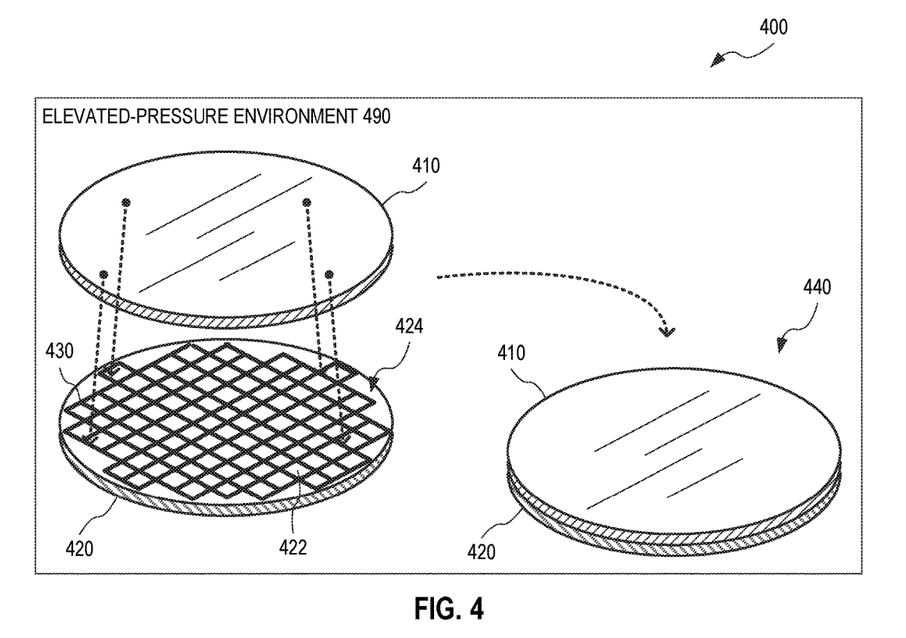
FIG. 4 illustrates a method for performing a portion of the method of FIG. 3 to produce a composite wafer, according to an embodiment.
Figure 5:
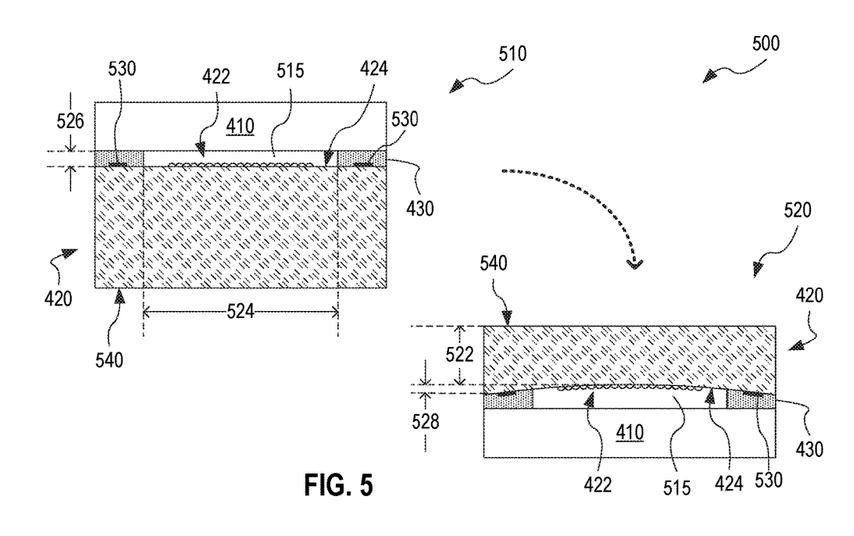
FIG. 5 illustrates a method for performing a portion of the method of FIG. 3, based upon the composite wafer of FIG. 4, to curve light-receiving surfaces, according to an embodiment.

FIG. 4 illustrates one exemplary method 400 for performing step 310 of method 300 (FIG. 3) to produce a composite wafer 440. Method 400 takes place in an environment 490 having elevated pressure. For example, method 400 takes place in a pressurized chamber. FIG. 5 illustrates one exemplary method 500 for performing step 330 of method 300 (FIG. 3), based upon composite wafer 440 formed in method 400. Method 500 takes place at atmospheric pressure. FIGS. 4 and 5 are best viewed together.

Method 400 applies a bonding layer 430 to a CMOS image sensor wafer 420 having a plurality of CMOS pixel arrays 422. Each CMOS pixel array 422 is an embodiment of pixel array 112 (FIG. 1), in a planar form. Bonding layer 430 is applied on a surface 424 of image sensor wafer 420, around each pixel array 422. Bonding layer 430 is, for example, a spacer with an adhesive. Surface 424 is the light-receiving surface of image sensor wafer 420, i.e., the surface associated with the light-receiving surfaces of pixel arrays 422. Although FIG. 4 shows each pixel array 422 as being surrounded by a rectangularly shaped portion of bonding layer 430, the shape of bonding layer 430 around each or some of pixel arrays 422 may be different from rectangular, for example elliptical, without departing from the scope hereof.

After depositing bonding layer 430 on image sensor wafer 420, method 400 disposes a light-transmitting substrate 410 on bonding layer 430. Next, method 400 cures an adhesive of bonding layer 430 to complete the formation of composite wafer 440 with a hermetically sealed cavity above each pixel array 422. In one example of method 400, bonding layer 430 includes a spacer and an epoxy, and method 400 stencil-prints a first epoxy layer onto surface 424, disposes the spacer on the first epoxy layer, stencil prints a second epoxy layer on the spacer, disposes light-transmitting substrate 410 on the second epoxy layer, and cures both epoxy layers using ultra-violet light and/or heat.

Diagram 510 of FIG. 5 shows, in cross-sectional side view, a portion of composite wafer 440 associated with one pixel array 422. The processing performed by method 500 is discussed below in reference to the portion of composite wafer shown in diagram 510. However, it is understood that method 500 applies the processing, shown in FIG. 5, at the wafer-level to all of composite wafer 440, or at least to a portion of composite wafer 440 associated with the plurality of pixel arrays 422.

The portion of composite wafer 440 shown in diagram 510 includes a portion of image sensor wafer 420 with one pixel array 422, a portion of bonding layer 430 surrounding pixel array 422, and a portion of light-transmitting substrate 410 bonded onto this portion of bonding layer 430. Above pixel array 422 is a hermetically sealed cavity 515 formed in method 400. Hermetically sealed cavity 515 is bounded by light-receiving surface 424, bonding layer 430, and light-transmitting substrate 410. Hermetically sealed cavity 515 has a characteristic dimension 524, parallel to light-transmitting substrate 410. Dimension 524 is, for example, a diameter, a side-length of a rectangle, or a major or minor axis of an ellipse. Electrical contacts 530 to pixel array 422 are located on light-receiving surface 424, at the interface between image sensor wafer 420 and bonding layer 430. Bonding layer 430 has a thickness 526 which is, for example, in the range from 20 to 100 microns. In one implementation, thickness 526 is about 45 micron, and bonding layer 430 includes a spacer having a thickness of about 40 micron.

Method 500 thins a surface 540 of image sensor wafer 420 as shown in diagram 520. Surface 540 faces away from light-transmitting substrate 410. Method 500 continuously removes material from surface 540 and flattens surface 540. As image sensor wafer 420 becomes more deformable, the pressure differential between hermetically sealed cavity 515 and the ambient atmospheric pressure concavely curves light-receiving surface 424. Method 500 stops when image sensor wafer 420 has been thinned to a thickness resulting in a pre-specified curvature of light-receiving surface 424.

In one embodiment of methods 400 and 500, the elevated pressure of environment 490 in method 400 cooperates with thickness 522 and dimension 524 to produce the pre-specified curvature.

The curvature of light-receiving surface 422 may be, at least partly characterized by the maximum deflection 528 of light-receiving surface 422 in diagram 520 from the initial planar state of light-receiving surface 422 in diagram 510. In one embodiment, deflection 528 is in the range from one to fifty microns, and dimension 524 is in the range from 1.5 to 10 millimeters. However, deflection 528 and/or dimension 524 may differ from these values without departing from the scope hereof.

A theoretical model considers deformation of a silicon diaphragm subject to a pressure differential. This model, although idealized, provides approximate values for parameters of methods 400 and 500 required to achieve a pre-specified curvature of light-receiving surface 424 at pixel array 422. For the purpose of this model, the curvature of light-receiving surface 424 is represented by deflection 528.

According to this model, deflection 528 is given by $Y=3(1-v^2)P(D/2)^4/(16ET^3)$, wherein v is Poisson's ratio for silicon <100> wherein <100> is the Miller index indicating the crystalline orientation, E is Young's modulus for silicon, P is the pressure differential across image sensor wafer, D is dimension 524, and T is thickness 522. The model assumes that dimension 524 indicates a diameter. Table 1 shows exemplary values for deflection 528 (Y), given exemplary values for P, D, and T, and assuming that v=0.25 and $E=1.9\times10^{-11}$ Pascal.

TABLE 1

| Y [micron] | P [atmospheres] | D [millimeters] | T [micron] |
|---|---|---|---|
| 3.7 | 1 | 5.0 | 100 |
| 11 | 1 | 5.0 | 70 |
| 11 | 3 | 5.0 | 100 |
| 10 | 1 | 6.0 | 90 |

As seen in Table 1, different magnitudes of deflection 528 may be achieved by appropriate choices of pressure differential, dimension 524, and thickness 522. Table 1 also shows that larger pixel arrays 112, generally associated with larger dimensions 524, require a smaller pressure differential than smaller pixel arrays 112, generally associated with smaller dimensions 524, to achieve a certain magnitude of deflection 528. For a pre-specified curvature and a given dimension 524, method 300 presents a trade-off between pressure differential and thickness 522. In one example, a relatively low pressure differential is preferred in order to reduce the impact of any potential pressure losses of hermetically sealed cavity 515 during the life of this embodiment of curved image sensor system 100.

Figure 6:
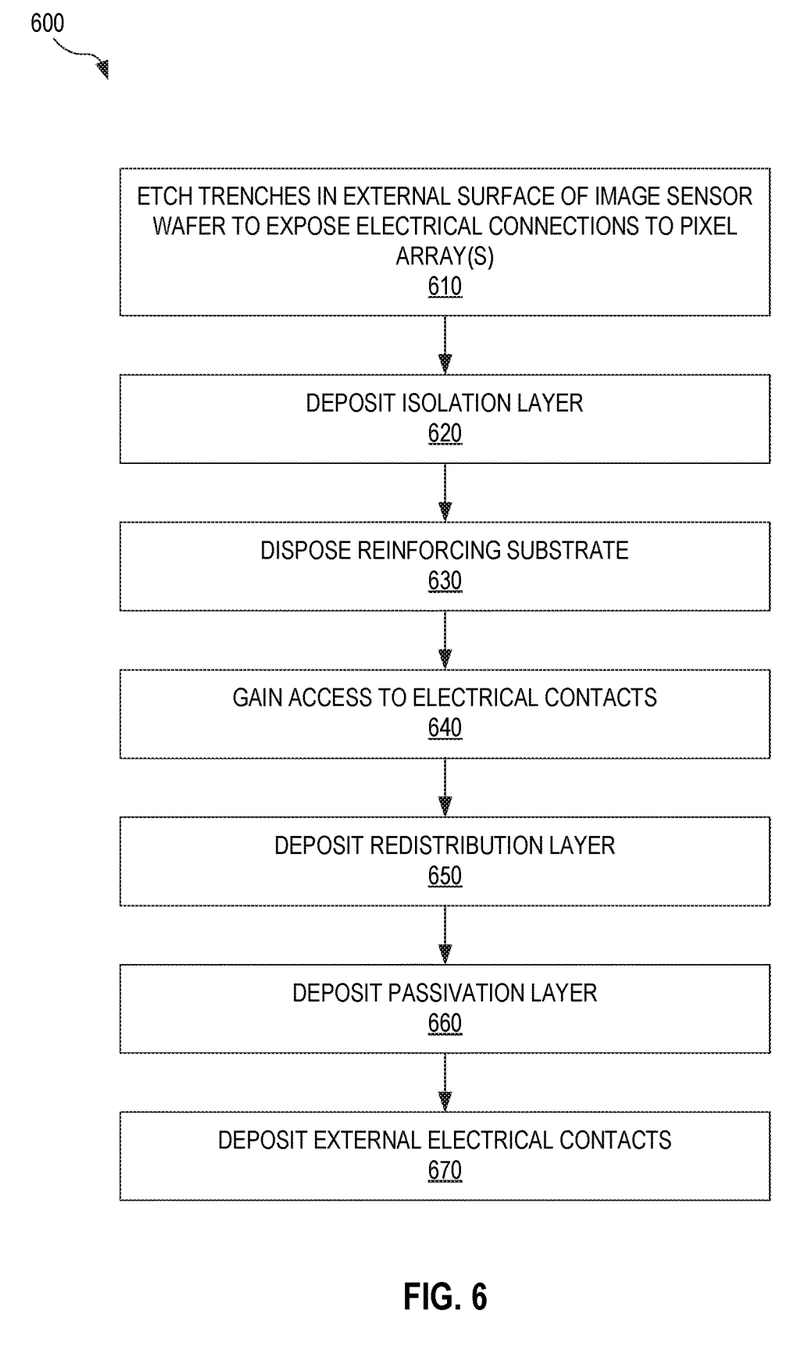
FIG. 6 illustrates a method for performing a portion of the method of FIG. 3, based upon the composite wafer of FIG. 4 as modified by the method of FIG. 5, according to an embodiment.
Figure 7:
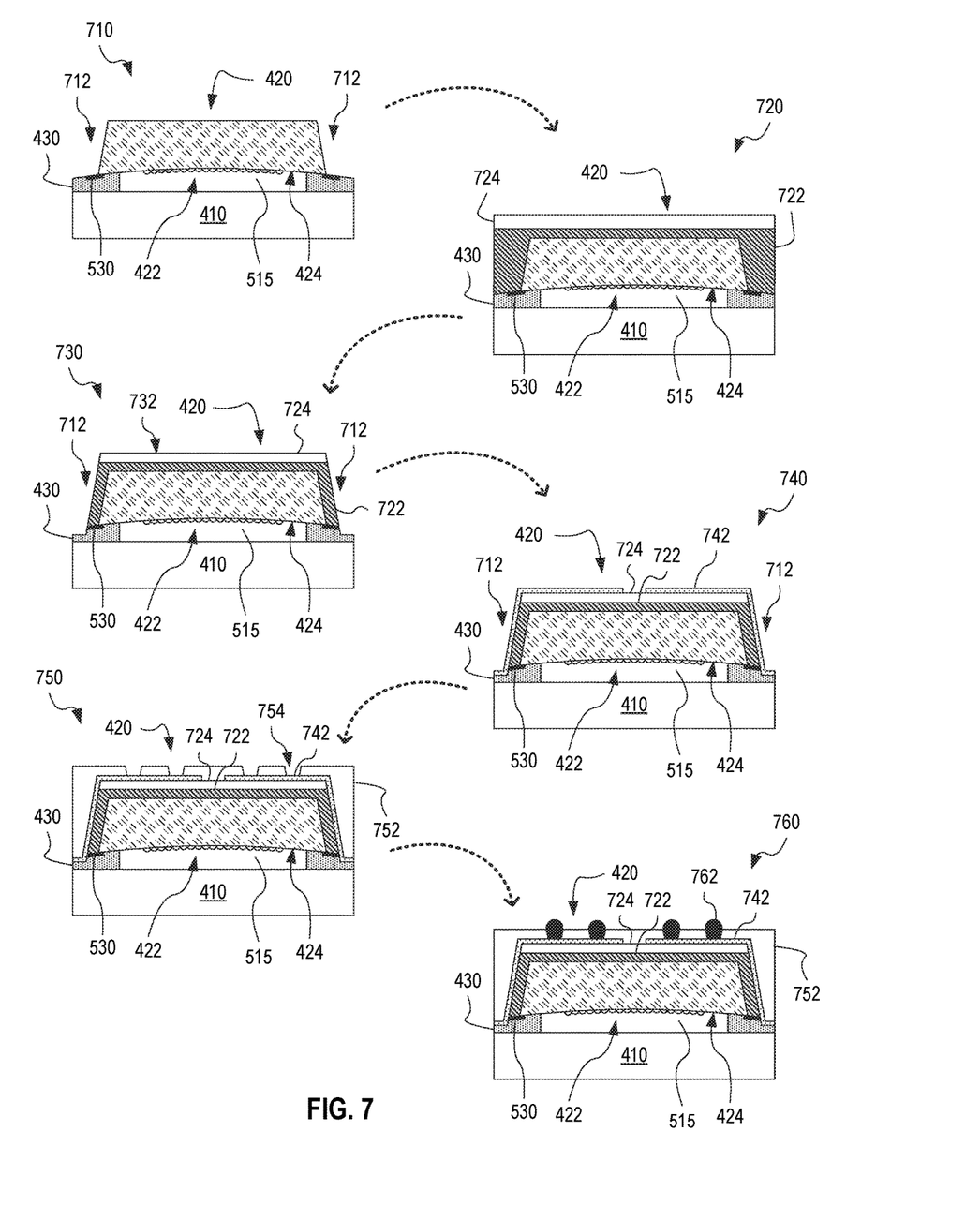
FIG. 7 schematically shows steps of the method of FIG. 6, according to an embodiment.

FIG. 6 illustrates one exemplary method 600 for performing steps 340 and 345 of method 300 (FIG. 3), based upon composite wafer 440 (FIG. 4) as modified by method 500 (FIG. 5). The input to method 600 is composite wafer 440 in the form indicated by diagram 520 of FIG. 5. Method 600 processes surface 540 of composite wafer 440. FIG. 7 is a series of diagrams 710, 720, 730, 740, 750, and 760 schematically showing exemplary steps of method 600. FIGS. 6 and 7 are best viewed together.

In a step 610, method 600 etches trenches 712 (see diagram 710) into image sensor wafer 420, to expose electrical contacts 530. Step 610 may utilize photoresist patterning to properly position trenches 712 above electrical contacts 530 and bonding layer 430.

In a step 620, method 600 deposits an isolation layer 722 (see diagram 720) on image sensor wafer 420, including within trenches 712.

In a step 630, method 600 deposits a reinforcing substrate 724 (see diagram 720) on isolation layer 722. Reinforcing substrate 724 may be a glass substrate. In one example of step 630, reinforcing substrate 724 is a glass substrate of thickness in the range between 50 micron and 200 micron, such as about 100 micron. Reinforcing substrate 724 may be bonded to isolation layer 722 using methods known in the art.

In a step 640, trenches 712 are reopened to regain access to electrical contacts 530 (see diagram 730). Step 640 may utilize methods known in the art, such as blade notch, laser drilling, and/or etching. Step 640 includes removing material from reinforcing substrate 724 and isolation layer 722, and optionally also from one or both of bonding layer 430 and electrical contacts 530.

In a step 650, method 600 deposits a redistribution layer 742 on image sensor wafer 420 (see diagram 740). Redistribution layer 742 forms electrical connections between top surface 732 of image sensor wafer 420 and electrical contacts 530. Redistribution layer 742 includes a metal. In one example, redistribution layer 742 is AlCu, Cu, or another metal deposited onto image sensor wafer 420 using electroplating, or other methods known in the art. In another example, redistribution layer 742 is electroless plated Ni/Au.

In a step 660, method 600 deposits a passivation layer 752 (see diagram 750), for example using methods known in the art. Passivation layer 752 is an electrical insulator. Passivation layer 752 may be solder mask or another organic material. Passivation layer has openings 754 that expose redistribution layer 742.

In a step 670, method 600 deposits external electrical contacts 762 (see diagram 760) in openings 754. Step 670 may utilize methods known in the art. In one example, external electrical contacts 762 are a ball grid array deposited by printing, ball placement, or other methods known in the art. This ball grid array may be composed of a lead-free material or another solder material.

Referring now again to FIG. 3, in an embodiment, method 300 applies step 350 to the composite wafer produced by completing method 600 and illustrated by diagram 760. In this embodiment, step 350 produces the curved image sensor system shown in diagram 760. This curved image sensor system is a frontside-illuminated CMOS image sensor which is an embodiment of curved image sensor system 100 (FIG. 1).

It is understood that embodiments shown in FIGS. 4, 5, and 7 may not be drawn to scale, and the actual embodiments may have dimensions and shapes different from the ones shown in FIGS. 4, 5, and 7. For example, reinforcing substrate 724 may be significantly thicker than isolation layer 722.

Without departing from the scope hereof, reinforcing layer 724 may be an integrated circuit substrate such as a CMOS logic wafer with image processing and driver circuitry for each pixel array 422. In one implementation, this CMOS logic wafer has electrical connection pads facing away from isolation layer 722. In this implementation, step 650 deposits redistribution layer 742 to connect electrical contacts 530 to at least some of the electrical connection pads of the CMOS logic wafer, and steps 660 and 670 cooperate to place external electrical contacts 762 on electrical connection pads of the CMOS logic wafer. In another similar implementation, the CMOS logic wafer has electrical connection pads facing isolation layer 722. In this implementation, step 640 exposes these electrical connection pads, and step 650 deposits redistribution layer 742 to connect electrical contacts 530 to such exposed electrical connection pads of the CMOS logic wafer.

Also without departing from the scope hereof, method 600 may form through-silicon vias in composite wafer 440 to produce at least some electrical connections.

Figure 8:
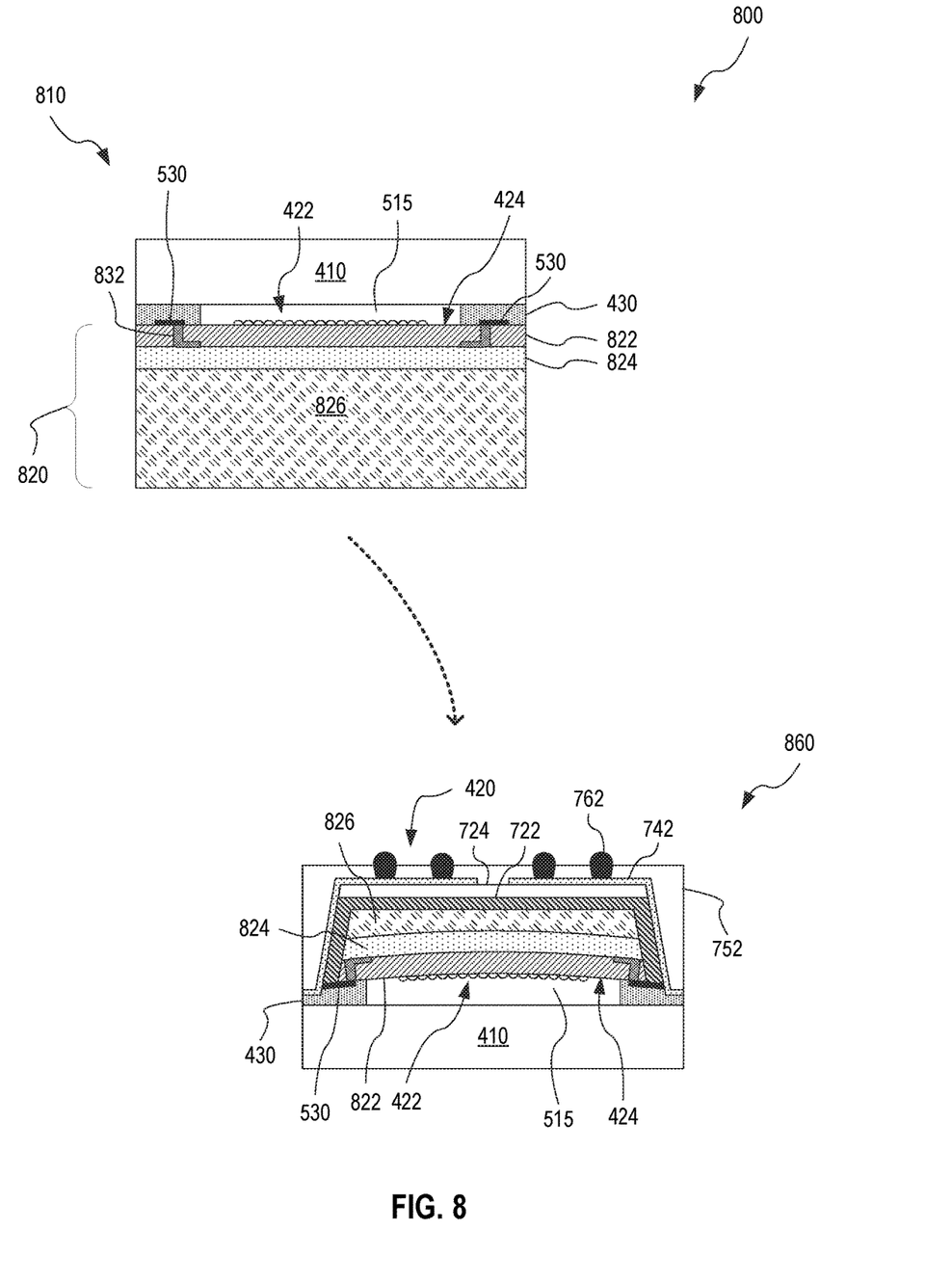
FIG. 8 schematically illustrates a method for manufacturing a curved image sensor system having a backside-illuminated CMOS image sensor, according to an embodiment.

FIG. 8 schematically illustrates one exemplary method 800 for manufacturing an embodiment of curved image sensor system 100 (FIG. 1), which implements curved image sensor 110 as a backside-illuminated CMOS image sensor. Method 800 is an embodiment of method 300 (FIG. 3). Method 800 is similar to the embodiment of method 300 discussed in reference to FIGS. 4, 5, 6, and 7, except for being based upon backside-illuminated image sensors. The following discussion is concerned with differences between method 800 and the embodiment that is based upon methods 400, 500, and 600.

As compared to method 400, method 800 replaces image sensor wafer 420 with a backside-illuminated image sensor wafer 820 (see diagram 810 which is a version of diagram 510 modified to illustrate the equivalent stage of method 800). Backside-illuminated image sensor wafer 820 includes (a) a carrier wafer 826, (b) at least one backside-illuminated CMOS image sensor 822, and (c) one or more oxide layers 824 that bonds each backside-illuminated image sensor 822 to carrier wafer 826. Each backside-illuminated CMOS image sensor 822 implements light-receiving surface 424 and pixel array 422 according to a backside-illuminated configuration. Each backside-illuminated CMOS image sensor 822 further includes electrical contacts 530 and electrical connections 832. Electrical connections 832 connect electrical contacts 530 to pixel circuitry (not shown in FIG. 8) adjacent to the frontside of image sensor 822, i.e., the side of image sensor 822 facing away from pixel array 422.

Without departing from the scope hereof, carrier wafer 826, or reinforcing substrate 724 as discussed in reference to FIG. 7, may include image processing and driver circuitry for each backside-illuminated CMOS image sensor 822.

Method 800 processes the composite wafer of diagram 810 as discussed in reference to FIGS. 5, 6, and 7 to produce a composite wafer with a least one backside-illuminated image sensor (see diagram 860 which is a version of diagram 760 modified to illustrate the equivalent stage of method 800).

Referring now again to FIG. 3, in an embodiment, method 300 applies step 350 to the composite wafer produced by method 800 and illustrated in diagram 860. In this embodiment, step 350 produces the curved image sensor system shown in diagram 860. This curved image sensor system is a backside-illuminated CMOS image sensor which is an embodiment of curved image sensor system 100 (FIG. 1).

Combinations of Features

Features described above as well as those claimed below may be combined in various ways without departing from the scope hereof. For example, it will be appreciated that aspects of one curved image sensor system, or method for manufacturing the same, described herein may incorporate or swap features of another curved image sensor system, or method for manufacturing the same, described herein. The following examples illustrate possible, non-limiting combinations of embodiments described above. It should be clear that many other changes and modifications may be made to the methods and device herein without departing from the spirit and scope of this invention:

(A1) A method for manufacturing one or more curved image sensor systems may include (a) at elevated pressure relative to atmospheric pressure, bonding a light-transmitting substrate to an image sensor wafer having at least one photosensitive pixel array, to form a composite wafer with a respective hermetically sealed cavity between the light-transmitting substrate and each of the at least one photosensitive pixel array, and (b) thinning the image sensor wafer of the composite wafer to induce deformation of the image sensor wafer to form, from each of the at least one pixel array, a respective concavely curved pixel array.

(A2) In the method denoted as (A1), the step of thinning may include, for each of the at least one pixel array, deforming the light-receiving surface of the pixel array to concavely curve the light-receiving surface.

(A3) In each of the methods of claim (A1) and (A2), the step of thinning may include, for each of the at least one pixel array, thinning the image sensor wafer to a thickness that, when the composite wafer is at atmospheric pressure, cooperates with (a) elevated pressure in the respective hermetically sealed cavity and (b) dimensions of the respective hermetically sealed cavity, to concavely curve the light-receiving surface of the pixel array with a pre-specified curvature.

(A4) In the method denoted as (A3), for each concavely curved pixel array, the pre-specified curvature may result in improved uniformity, across the concavely curved pixel array, of chief ray angle of light incident on the concavely curved pixel array, as compared to a planar pixel array.

(A5) In each of the methods denoted as (A3) and (A4), for each concavely curved pixel array, the pre-specified curvature may result in reduced field curvature in an image captured using the concavely curved pixel array, as compared to an image captured using a planar pixel array.

(A6) Each of the methods denoted as (A1) through (A5) may include performing the step of thinning at the atmospheric pressure.

(A7) In each of the methods denoted as (A1) through (A6), the step of bonding may include (a) depositing a bonding layer, having an adhesive, on the image sensor wafer and around each of the at least one pixel array, (b) disposing the light-transmitting substrate on the bonding layer, and (c) curing the adhesive to form the hermetically sealed cavity.

(A8) In each of the methods denoted as (A1) through (A7), the step of thinning may include thinning a first surface of the image sensor wafer facing away from the light-transmitting substrate.

(A9) In the method denoted as (A8), the step of thinning may include thinning the first surface to a thickness that allows elevated pressure in the hermetically sealed cavity to concavely curve the respective pixel array.

(A10) Each of the methods denoted as (A8) and (A9) may include performing the step of thinning at the atmospheric pressure, wherein the step of thinning the first surface comprising flattening the first surface.

(A11) Each of the methods denoted as (A8) through (A10) may further include modifying the first surface to produce an electrical interface to each concavely curved pixel array.

(A12) In the method denoted as (A11), the step of thinning may include flattening the first surface to form a planar first surface, and the step of modifying may include processing the planar first surface to produce the electrical interface.

(A13) In the method denoted as (A12), the step of processing may include etching through the image sensor wafer, from the planar first surface, to expose electrical connections located at surface of the image sensor wafer facing the light-transmitting substrate.

(A14) In each of the methods denoted as (A1) through (A13), the at least one pixel array may be a plurality of pixel arrays.

(A15) The method denoted as (A14) may further include dicing the composite wafer to produce a plurality of curved image sensor systems, each including a concavely curved pixel array.

(A16) In each of the methods denoted as (A1) through (A13), the at least one pixel array may be exactly one pixel array.

(A17) In each of the methods denoted as (A1) through (A16), the photosensitive pixel array may be backside-illuminated.

(A18) In each of the methods denoted as (A1) through (A16), the photosensitive pixel array may be frontside-illuminated.

(B1) A curved image sensor system may include (a) an image sensor substrate having a concave light-receiving surface and a photosensitive pixel array located along the concave light-receiving surface, (b) a light-transmitting substrate bonded to the image sensor substrate by a bonding layer, and (c) a hermetically sealed cavity, optically upstream from the pixel array and bounded at least by the concave light-receiving surface, the light-transmitting substrate, and the bonding layer.

(B2) In the curved image sensor system denoted as (B1), the hermetically sealed cavity may have elevated pressure, relative to atmospheric pressure.

(B3) Each of the curved image sensor systems denoted as (B1) and (B2) may further include a reinforcing substrate to maintain the concave light-receiving surface.

(B4) In the curved image sensor system denoted as (B3), the reinforcing substrate may be a complementary metal-oxide-semiconductor integrated circuit that is electrically coupled to the photosensitive pixel array.

(B5) In each of the curved image sensor systems denoted as (B1) through (B4), the surface of the image sensor substrate, facing away from the light-receiving surface, may be planar.

(B6) In each of the curved image sensor systems denoted as (B1) through (B5), the photosensitive pixel array may be frontside-illuminated.

(B7) The curved image sensor system denoted as (B6) may include electrical circuitry for communicating with the photosensitive pixel array, wherein the electrical circuitry is located, in part, at the interface between the image sensor and the bonding layer.

(B8) In each of the curved image sensor systems denoted as (B1) through (B4), the photosensitive pixel array may be implemented in a backside-illuminated image sensor.

(B9) The curved image sensor system denoted as (B8) may further include electrical circuitry for communicating with the pixel array, wherein the electrical circuitry is located, in part, at the interface between the backside-illuminated image sensor and the bonding layer.

(B10) Each of the curved image sensor systems denoted as (B8) and (B9) may further include a reinforcing substrate for the backside-illuminated image sensor.

(B11) In the curved image sensor system denoted as (B10), the reinforcing substrate may be a CMOS integrated circuit that is electrically coupled to the backside-illuminated image sensor.

(B12) Each of the curved image sensor systems denoted as (B1) through (B11) may further include an imaging objective for forming an image on the pixel array.

(B13) In the curved image sensor system denoted as (B12), the light-receiving surface, at each pixel of the pixel array, may be substantially normal to the corresponding chief ray angle of light received from the imaging objective.

(B14) In each of the curved image sensor systems denoted as (B12) and (B13), the light-receiving surface, at the pixel array, may substantially coincide with the Petzval surface of the imaging objective.

(B15) Each of the curved image sensor systems denoted as (B1) through (B14) may be manufactured using one or more of the methods denoted as (A1) through (A18).

Changes may be made in the above systems and methods without departing from the scope hereof. It should thus be noted that the matter contained in the above description and shown in the accompanying drawings should be interpreted as illustrative and not in a limiting sense. The following claims are intended to cover generic and specific features described herein, as well as all statements of the scope of the present method and systems, which, as a matter of language, might be said to fall therebetween.

What is claimed is:

1. A curved image sensor system comprising:
an image sensor substrate formed from monolithic silicon and having (a) a concave light-receiving surface, (b) a photosensitive pixel array located along the concave light-receiving surface, and (c) a planar external surface facing away from the concave light-receiving surface, the planar external surface including entire back surface of the image sensor substrate;
a light-transmitting substrate bonded to the image sensor substrate by a bonding layer; and
a hermetically sealed cavity optically upstream from the pixel array and bounded at least by the concave light-receiving surface, the light-transmitting substrate, and the bonding layer.

2. The curved image sensor system of claim 1, the hermetically sealed cavity having elevated pressure, relative to atmospheric pressure.

3. The curved image sensor system of claim 2, planarity of the planar external surface being achieved by thinning the image sensor substrate while the concave light-receiving surface is being formed from pressure differential between the elevated pressure in the hermetically sealed cavity and a relatively lower pressure outside the hermetically sealed cavity.

4. The curved image sensor system of claim 1, further comprising a reinforcing substrate, coupled with the planar external surface, to maintain the concave light-receiving surface.

5. The curved image sensor system of claim 4, the reinforcing substrate being a complementary metal-oxide-semiconductor integrated circuit that is electrically coupled to the photosensitive pixel array.

6. The curved image sensor system of claim 1, the photosensitive pixel array being frontside-illuminated and the curved image sensor system further including electrical circuitry for communicating with the pixel array, the electrical circuitry being located, in part, at interface between the image sensor substrate and the bonding layer.

7. The curved image sensor system of claim 1,
the photosensitive pixel array being implemented in a backside-illuminated image sensor; and
the curved image sensor system further comprising electrical circuitry for communicating with the pixel array, the electrical circuitry being located, in part, at interface between the backside-illuminated image sensor and the bonding layer.

8. The curved image sensor system of claim 7, further comprising a reinforcing substrate, coupled with the planar external surface, for the backside-illuminated image sensor.

9. The curved image sensor system of claim 8, the reinforcing substrate being a complementary metal-oxide-semiconductor integrated circuit that is electrically coupled to the backside-illuminated image sensor.

10. The curved image sensor system of claim 1,
further comprising an imaging objective for forming an image on the pixel array; and
the light-receiving surface, at each pixel of the pixel array, being substantially normal to a corresponding chief ray angle of light received from the imaging objective.

11. The curved image sensor system of claim 1,
further comprising an imaging objective for forming an image on the pixel array; and
the light-receiving surface, at the pixel array, substantially coinciding with Petzval surface of the imaging objective.

* * * * *